United States Patent
Nagasawa

(10) Patent No.: US 12,537,372 B2
(45) Date of Patent: Jan. 27, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Hironori Nagasawa, Yokohama Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 204 days.

(21) Appl. No.: 18/231,824

(22) Filed: Aug. 9, 2023

(65) Prior Publication Data

US 2024/0291263 A1    Aug. 29, 2024

(30) Foreign Application Priority Data

Feb. 28, 2023    (JP) .................................. 2023-029711

(51) Int. Cl.
*H02H 3/20*    (2006.01)
*H02H 1/00*    (2006.01)

(52) U.S. Cl.
CPC ............ *H02H 3/20* (2013.01); *H02H 1/0007* (2013.01)

(58) Field of Classification Search
CPC .......... H02H 3/20; H02H 1/00; H02H 1/0007; H02H 9/025; H03K 17/08; H03K 17/0822; H02M 1/088
USPC ..................................... 361/86–87, 93.7–93.9
See application file for complete search history.

(56) References Cited

U.S. PATENT DOCUMENTS

| | | | |
|---|---|---|---|
| 8,957,652 B2 | 2/2015 | Yamauchi | |
| 10,348,079 B2 | 7/2019 | Yasusaka et al. | |
| 10,431,539 B2 | 10/2019 | Hayashi | |
| 2008/0074820 A1* | 3/2008 | Thiery | H03K 17/0822 361/93.7 |
| 2012/0313609 A1* | 12/2012 | Fukumura | G05F 1/573 323/284 |
| 2015/0028842 A1* | 1/2015 | Darshan | H02M 1/32 323/312 |

FOREIGN PATENT DOCUMENTS

| | | |
|---|---|---|
| JP | 2002-171749 A | 6/2002 |
| JP | 2006-042576 A | 2/2006 |
| JP | 2008-301617 A | 12/2008 |
| JP | 2012-134828 A | 7/2012 |
| JP | 2017-046570 A | 3/2017 |
| JP | 2018-129728 A | 8/2018 |

* cited by examiner

*Primary Examiner* — Danny Nguyen
(74) *Attorney, Agent, or Firm* — Kim & Stewart LLP

(57) ABSTRACT

According to one embodiment, a semiconductor device includes a first transistor, a first circuit, and a second circuit. A source of the first transistor is coupled to a first terminal. A gate of the first transistor is coupled to a first node. The first circuit includes a first comparator and a current limiting circuit. The second circuit includes a second comparator, a second transistor, a third transistor, and a third circuit. A source of the second transistor is grounded. A drain of the second transistor is coupled to the first node. The third circuit is configured to turn on the second transistor and the third transistor for a first time period based on an output of the second comparator.

9 Claims, 4 Drawing Sheets

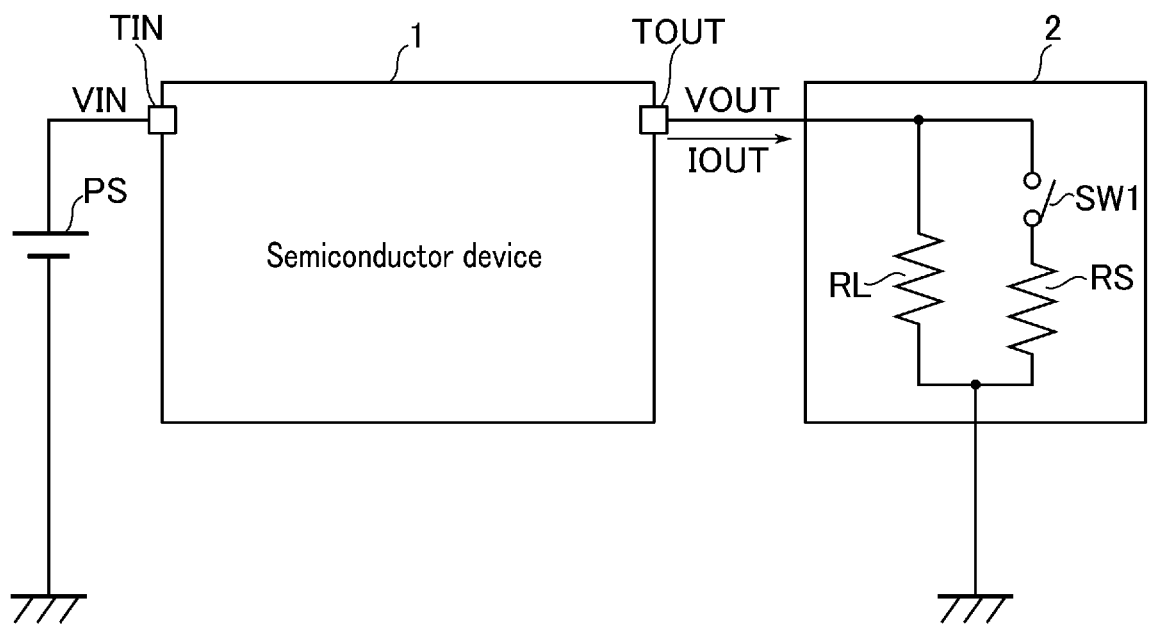
F I G. 1

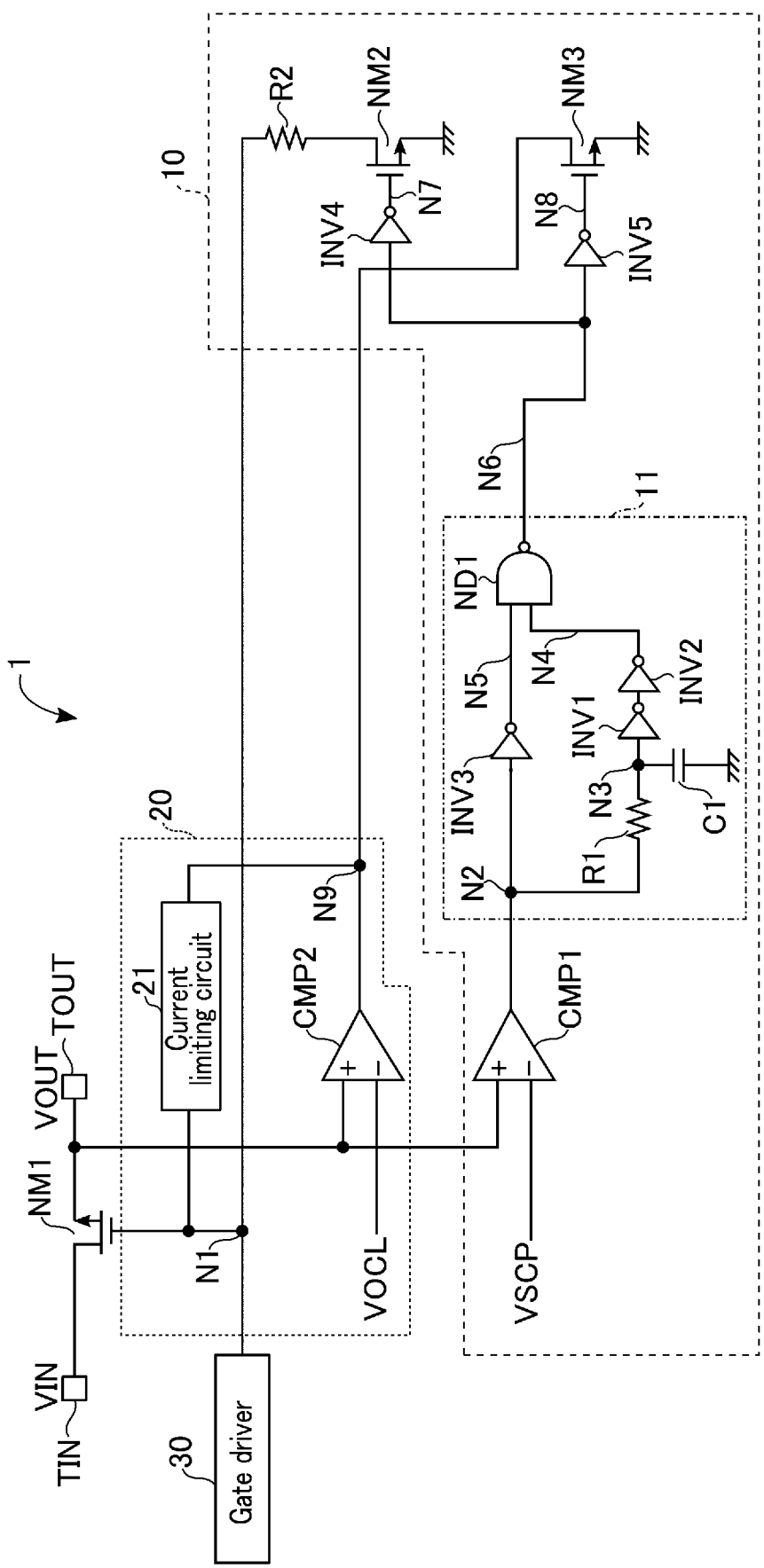
F I G. 2

SEMICONDUCTOR DEVICE

CROSS-REFERENCE TO RELATED APPLICATIONS

This application is based upon and claims the benefit of priority from Japanese Patent Application No. 2023-029711, filed Feb. 28, 2023, the entire contents of which are incorporated herein by reference.

FIELD

Embodiments described herein relate generally to a semiconductor device.

BACKGROUND

An overcurrent-protection equipped semiconductor device for supplying power to a load has been known.

BRIEF DESCRIPTION OF THE DRAWINGS

FIG. 1 is a block diagram showing an exemplary arrangement of a semiconductor device according to the first embodiment, an electronic device which receives power from the semiconductor device, and a power source which supplies power to the semiconductor device.

FIG. 2 is a circuit diagram showing an exemplary configuration of the semiconductor device according to the first embodiment.

DETAILED DESCRIPTION

Figure 3:
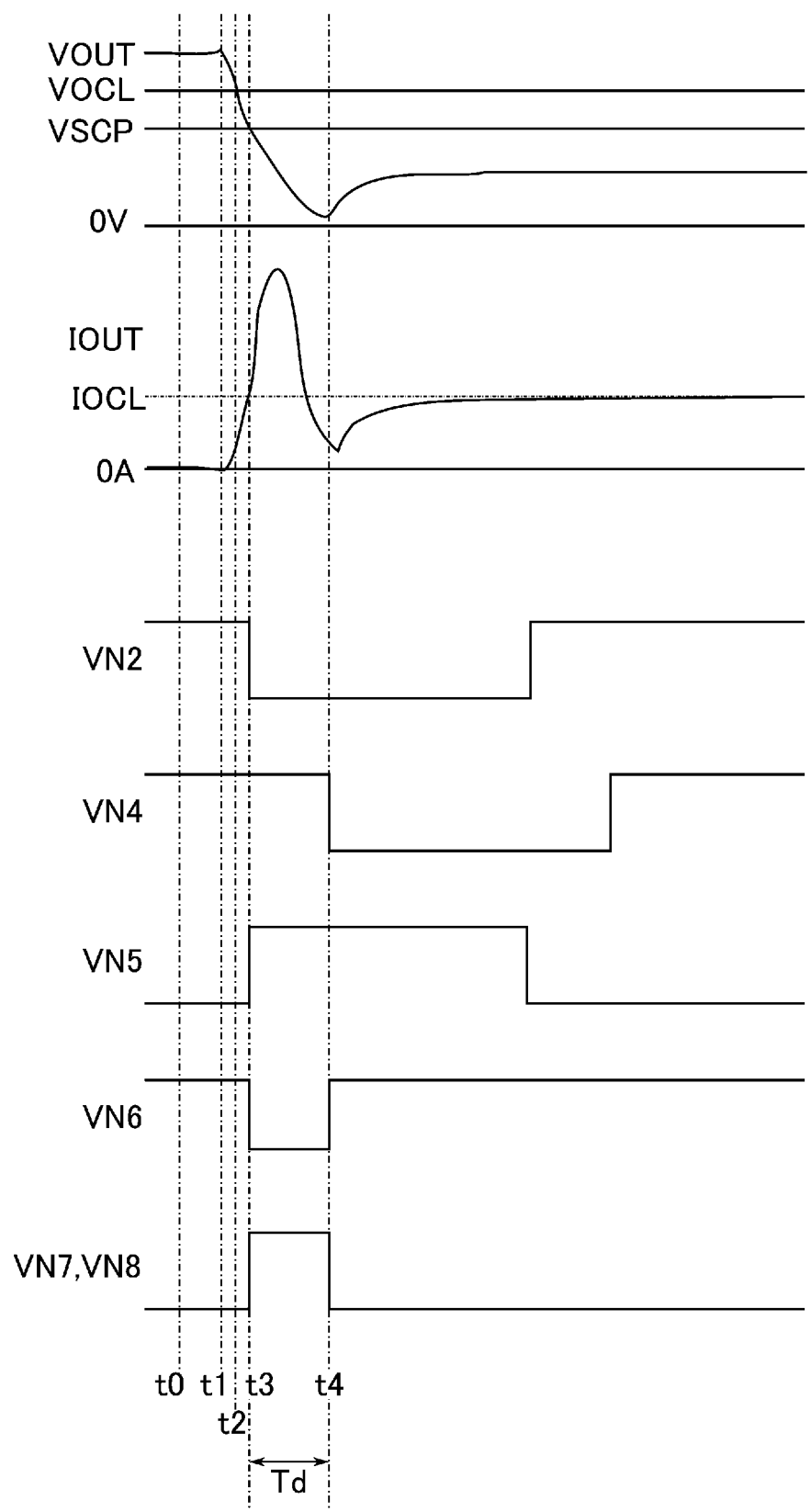
FIG. 3 is a timing chart showing an exemplary operation of the semiconductor device according to the first embodiment.

In general, according to one embodiment, a semiconductor device includes a first transistor, a first circuit, and a second circuit. A source of the first transistor is coupled to a first terminal. A gate of the first transistor is coupled to a first node. The first circuit includes a first comparator and a current limiting circuit. A non-inverting input terminal of the first comparator is coupled to the first terminal. A first voltage is applied to an inverting input terminal of the first comparator. One end of the current limiting circuit is coupled to an output terminal of the first comparator. The other end of the current limiting circuit is coupled to the first node. The second circuit includes a second comparator, a second transistor, a third transistor, and a third circuit. A non-inverting input terminal of the second comparator is coupled to the first terminal. A second voltage is applied to an inverting input terminal of the second comparator. A source of the second transistor is grounded. A drain of the second transistor is coupled to the first node. A source of the third transistor is grounded. A drain of the third transistor is coupled to the output terminal of the first comparator. The third circuit is configured to turn on the second transistor and the third transistor for a first time period based on an output of the second comparator.

The embodiments will be described below with reference to the drawings. In the following description, the same numerals are assigned to structural components having the same functions and structures. The embodiments described below merely provide exemplified technical concepts. The embodiments therefore do not restrict the materials, geometries, structures, arrangements, etc. of the components, and various modifications can be made thereto.

<1> First Embodiment

A semiconductor device according to the first embodiment will be described.
<1-1> Configuration FIG. 1 is a block diagram showing an exemplary arrangement of the semiconductor device according to the first embodiment, an electronic device which receives power supply from the semiconductor device, and a power source which supplies power to the semiconductor device. A semiconductor device 1 is a load switch configured to supply power to a load and provided with overcurrent protection. The semiconductor device 1 may be an integrated circuit (IC) chip. The semiconductor device 1 may also be referred to as an electronic fuse. An electronic device 2 is a device which receives a power supply voltage applied by the semiconductor device 1 and realizes various functions. The electronic device 2 may be an IC chip, or may be a control circuit of an industrial robot. A power source PS is a voltage source for outputting a direct-current voltage.

The semiconductor device 1 includes terminals TIN and TOUT. The terminal TIN is an input terminal of the semiconductor device 1. The power source PS, which is provided outside the semiconductor device 1, is coupled to the terminal TIN, and a voltage VIN is applied to the terminal TIN. The terminal TOUT is an output terminal of the semiconductor device 1. Power is supplied from the terminal TOUT to the electronic device 2 arranged outside the semiconductor device 1. More specifically, a voltage VOUT is output from the terminal TOUT to the electronic device 2, and a current IOUT is output from the terminal TOUT to the electronic device 2.

The semiconductor device 1 is provided with overcurrent protection. In particular, if the current IOUT increases to a large extent, the semiconductor device 1 regulates the voltage VOUT and current IOUT so as to protect the semiconductor device 1 and electronic device 2 from overcurrent damage.

The electronic device 2 includes resistors RL and RS, and a switch SW1. The resistors RL and RS each consume power. The resistor RL represents an amount of power consumed when the electronic device is operating normally, while the resistor RS represents an amount of power consumed when a breakdown occurs in the electronic device accompanied by short-circuiting to a node of a ground voltage. The resistance of the resistor RL is higher than that of the resistor RS. The resistance of the resistor RS takes a low value close to 0Ω. One end of the resistor RL is coupled to the terminal TOUT, while the other end of the resistor RL is grounded. One end of the switch SW1 is coupled to the terminal TOUT. One end of the resistor RS is coupled to the other end of the switch SW1, while the other end of the resistor RS is grounded.

The state of the electronic device 2 is switched in accordance with the on/off state of the switch SW1. With the switch SW1 being OFF, the electronic device 2 is in a normal state, by which power is consumed by the resistor RL. If the normal-state electronic device 2 is coupled to the semiconductor device 1, power is supplied from the semiconductor device 1 to this electronic device 2. With the switch SW1 being ON, the electronic device 2 is in a short-circuited state, in which power is consumed by the resistor RL and resistor RS. When the short-circuited electronic device 2 is coupled to the semiconductor device 1 and a large current flows thereto, the semiconductor device 1 conducts a protective operation.

FIG. 2 is a circuit diagram showing an exemplary configuration of the semiconductor device according to the first embodiment. The semiconductor device 1 further includes a transistor NM1, a short-circuit protection circuit 10, an overcurrent protection circuit 20, and a gate driver 30.

The transistor NM1 is an N-channel MOSFET. The source of the transistor NM1 is coupled to the terminal TOUT, the drain of the transistor NM1 is coupled to the terminal TIN, and the gate of the transistor NM1 is coupled to a node N1. The transistor NM1 in the ON state supplies power to the electronic device 2 via the terminal TOUT. The transistor NM1 in the OFF state supplies no power to the electronic device 2 via the terminal TOUT.

The short-circuit protection circuit 10 protects the semiconductor device 1 from an overcurrent caused by short-circuiting between the terminal TOUT and ground voltage. The short-circuit protection circuit 10 monitors the voltage VOUT, and when the terminal TOUT is short-circuited to the node of the ground voltage, it performs discharging at the node N1 and disables the overcurrent protection circuit 20 for a time period Td. The time period Td will be described later.

The overcurrent protection circuit 20 protects the semiconductor device 1 from an overcurrent. The overcurrent protection circuit 20 monitors the voltage VOUT, and when the current IOUT increases considerably, it regulates the magnitude of the current IOUT by controlling the voltage at the node N1.

The gate driver 30 applies a voltage to the node N1. The gate driver 30 may be a charge pump.

The short-circuit protection circuit 10 includes a comparator CMP1, inverters INV1 to INV5, resistors R1 and R2, a capacitor C1, a NAND gate ND1, and transistors NM2 and NM3. The transistors NM2 and NM3 are N-channel MOSFETs.

The non-inverting input terminal of the comparator CMP1 is coupled to the terminal TOUT. The inverting input terminal of the comparator CMP1 receives a voltage VSCP applied thereto. The voltage VSCP serves as a reference voltage for determining whether or not to operate the short-circuit protection circuit 10 when short-circuiting occurs between the terminal TOUT and a ground voltage. The voltage VSCP is lower than the voltage VIN and higher than 0 volts. The output terminal of the comparator CMP1 is coupled to a node N2.

One end of the resistor R1 is coupled to the node N2, and the other end of the resistor R1 is coupled to a node N3. One electrode of the capacitor C1 is coupled to the node N3, and the other electrode of the capacitor C1 is grounded. The inverter INV1 inverts the logic level of the node N3 and outputs the resultant level to the inverter INV2. The inverter INV2 inverts the output of the inverter INV1 and outputs the resultant level to the node N4.

The inverter INV3 inverts the logic level of the node N2 and outputs the resultant level to the node N5. The NAND gate ND1 performs a NAND operation upon the logic level of the node N4 and the logic level of the node N5, and outputs the result of the operation to the node N6.

The inverter INV4 inverts the logic level of the node N6 and outputs the resultant level to the node N7. The source of the transistor NM2 is grounded, and the gate of the transistor NM2 is coupled to a node N7. One end of the resistor R2 is coupled to the node N1, and the other end of the resistor R2 is coupled to the drain of the transistor NM2.

The inverter INV5 inverts the logic level of the node N6 and outputs the resultant level to the node N8. The source of the transistor NM3 is grounded, the drain of the transistor NM3 is coupled to the node N9, and the gate of the transistor NM3 is coupled to the node N8.

A group of the inverters INV1 to INV3, resistor R1, capacitor C1, and NAND gate ND1 may be referred to as a timing generator 11. That is, the input terminal of the timing generator 11 is coupled to the node N2, and the output terminal of the timing generator 11 is coupled to the node N6.

The overcurrent protection circuit 20 includes a comparator CMP2 and a current limiting circuit 21.

The non-inverting input terminal of the comparator CMP2 is coupled to the terminal TOUT. To the inverting input terminal of the comparator CMP2, a voltage VOCL is applied. The voltage VOCL serves as a reference voltage for determining whether or not to operate the overcurrent protection circuit 20 when the current IOUT increases considerably. The voltage VOCL is lower than the voltage VIN and higher than the voltage VSCP. The output terminal of the comparator CMP2 is coupled to the node N9.

One end of the current limiting circuit 21 is coupled to the node N9, and the other end of the current limiting circuit 21 is coupled to the node N1.

The overcurrent protection circuit 20 forms a negative feedback circuit in the path including the transistor NM1. In particular, the path from the output terminal of the comparator CMP2 to one end of the current limiting circuit 21, the other end of the current limiting circuit 21, the gate of the transistor NM1, the source of the transistor NM1, and the non-inverting input terminal of the comparator CMP2, forms a negative feedback circuit. With this negative feedback, the overcurrent protection circuit 20 controls the voltage at the node N1 when the voltage VOUT is lower than the voltage VOCL.

<1-2> Operation

The operation of the semiconductor device 1 will be described. The voltage of the node N1 will be referred to as a voltage VN1. Similarly, the voltages of nodes N2 to N9 will be referred to as voltages VN2 to VN9, respectively.

FIG. 3 is a timing chart showing an exemplary operation of the semiconductor device according to the first embodiment. According to FIG. 3, when supplying power to the electronic device 2, the semiconductor device 1 detects short-circuiting at the electronic device 2 and executes a protective operation. In this drawing, the voltages VOUT, VSCP, VOCL, the current IOUT, and the voltages VN2, VN4, VN5, VN6, VN7, and VN8 are presented.

At time t0, the electronic device 2 is in a normal state, and the semiconductor device 1 is supplying power to the electronic device 2. In particular, the switch SW1 is OFF, and the resistor RL is consuming power in the electronic device 2.

In the semiconductor device 1, the gate driver 30 supplies a voltage to the node N1. With the voltage of the node N1 being sufficiently high, the transistor NM1 is ON. The transistor NM1 in the ON state outputs to the terminal TOUT a voltage VOUT of approximately the same level as the voltage VIN.

In the short-circuit protection circuit 10, the comparator CMP1 compares the voltage VOUT with the voltage VSCP. At time t0, the voltage VOUT is higher than the voltage VSCP, and therefore the comparator CMP1 outputs the "H" level to the node N2. This sets the voltage VN2 to the "H" level. Since the node N2 has been maintained at the "H" level for a certain period of time, the capacitor C1 is sufficiently charged, and the voltage VN3 is set to the "H" level. The "H" level of the node N3 is inverted by the inverter INV1, and is again inverted by the inverter INV2, and as a result, the voltage VN4 is set to the "H" level. The inverter INV3 inverts the "H" level of the node N2 and outputs the resultant level to the node N5, and as a result, the voltage VN5 is set to the "L" level. The NAND gate ND1 performs a NAND operation upon the "H" level of the node N4 and the "L" level of the node N5, and outputs the "H" level to the node N6.

The inverter INV4 inverts the "H" level of the node N6 and outputs the resultant level to the node N7, and as a result, the voltage VN7 is set to the "L" level. With the voltage VN7 at the "L" level, the transistor NM2 is OFF. The short-circuit protection circuit 10 therefore does not conduct discharging at the node N1. The inverter INV5 inverts the "H" level of the node N6 and outputs the resultant level to the node N8, and as a result, the voltage VN8 is set to the "L" level. With the voltage VN8 at the "L" level, the transistor NM3 is OFF. The short-circuit protection circuit 10 therefore does not conduct discharging at the node N9. In other words, the short-circuit protection circuit 10 does not disable the overcurrent protection circuit 20.

At time t0, with the voltage VOUT being higher than the voltage VOCL, the overcurrent protection circuit 20 does not control the voltage at the node N1.

At time t1, the electronic device 2 is switched from the normal state to the short-circuited state. In particular, the switch SW1 changes from the OFF state to the ON state in the electronic device 2, and therefore the resistor RS starts consuming power in addition to the consumption by the resistor RL. With the resistance of the resistor RS having a value close to 0Ω, the current IOUT increases, and the voltage VOUT decreases after time t1. Time t1 represents the starting point of an increase in the current IOUT and a decrease in the voltage VOUT. At this time point, the voltage VOUT is higher than the voltage VSCP, and therefore there is no change from time t0 in the illustrated voltages VN2, VN4, VN5, VN6, VN7, and VN8.

At time t2, the voltage VOUT falls below the voltage VOCL. In response to this, the overcurrent protection circuit 20 starts an operation for controlling the voltage of the node N1. It requires, however, some time until the control actually begins after the initiation of the operation in the overcurrent protection circuit 20, which is configured to control the voltage of the node N1 using the negative feedback, and therefore the control of the current IOUT does not yet start. With the voltage VOUT being still higher than the voltage VSCP at this point, no change appears yet in the voltages VN2, VN4, VN5, VN6, VN7, and VN8 in comparison with time t0.

At time t3, the voltage VOUT falls below the voltage VSCP. This changes the operation of the short-circuit protection circuit 10. In particular, with the voltage VOUT being lower than the voltage VSCP, the comparator CMP1 outputs the "L" level to the node N2. This changes the voltage VN2 to the "L" level. The voltage VN3 is maintained at the "H" level by the resistor R1 and capacitor C1, and therefore it does not change from the "H" level at time t3. Since there is no change to the voltage VN3, the voltage VN4 also does not change from the "H" level. The inverter INV3 inverts the "L" level of the node N2 and outputs the resultant level to the node N5, and as a result, the voltage VN5 changes to the "H" level. The NAND gate ND1 performs a NAND operation upon the "H" level of the node N4 and the "H" level of the node N5, and outputs the "L" level to the node N6.

The inverter INV4 inverts the "L" level of the node N6 and outputs the resultant level to the node N7, and as a result, the voltage VN7 changes to the "H" level. With the change of the voltage VN7 to the "H" level, the transistor NM2 is turned ON. Via the transistor NM2 in the ON state and the resistor R2, the node N1 is coupled to the node of the ground voltage. The short-circuit protection circuit 10 thereby performs discharging at the node N1.

The inverter INV5 inverts the "L" level of the node N6 and outputs the resultant level to the node N8, and as a result, the voltage VN8 changes to the "H" level. With the change of the voltage VN8 to the "H" level, the transistor NM3 is turned ON. Via the transistor NM3 in the ON state, the node N9 is coupled to the node of a ground voltage. Through discharging at the node N9 and deactivation of the negative feedback of the overcurrent protection circuit 20, the short-circuit protection circuit 10 disables the overcurrent protection circuit 20. The length from time t2 to time t3 is too short for the negative feedback of the overcurrent protection circuit 20 to start functioning. Thus, the overcurrent protection circuit 20 becomes disabled by the short-circuit protection circuit 10 before it begins the control of the current IOUT.

The discharging of the node N1 begins at time t3. It requires time, however, for the voltage VN1 to be lowered and for the transistor NM1 to start regulating the current. The current IOUT therefore continues to increase even after time t3, until it reaches its peak. After the peak, the current IOUT is lowered. The voltage VOUT continues to decrease after time t3.

The charge accumulated in the capacitor C1 is discharged to the node N2 of the "L" level via the resistor R1. That is, the voltage of the node N3 decreases after time t3.

At time t4, the voltage of the node N3 falls below the threshold voltage of the logic level of the inverter INV1. In other words, the inverter INV1 determines the voltage VN3 as the "L" level and outputs the "H" level to the inverter INV2. The inverter INV2 that has received the "H" level inverts this logic level, and outputs the "L" level to the node N4. Since the voltage VN5 stays at the "H" level after time t3, the NAND gate ND1 performs a NAND operation upon the "L" level of the node N4 and the "H" level of the node N5, and outputs the "H" level to the node N6.

The inverter INV4 inverts the "H" level of the node N6 and outputs the resultant level to the node N7, and as a result, the voltage VN7 changes to the "L" level. With the change of the voltage VN7 to the "L" level, the transistor NM2 is turned OFF. With the transistor NM2 turned to the OFF state, the discharging of the node N1 is terminated.

The inverter INV5 inverts the "H" level of the node N6 and outputs the resultant level to the node N8, and as a result, the voltage VN8 changes to the "L" level. With the change of the voltage VN8 to the "L" level, the transistor NM3 is turned OFF. With the transistor NM3 turned to the OFF state, the discharging of the node N9 is terminated, and the negative feedback of the overcurrent protection circuit 20 is resumed. In other words, the overcurrent protection circuit 20 is now enabled.

After time t4, the current IOUT is regulated by the overcurrent protection circuit 20, and the voltage VOUT is limited to a certain positive value that corresponds to the current IOUT.

The time period Td indicates a period from time t3 to time t4. The time period Td is longer than the period between the start of discharging at the node N1 and the current IOUT reaching its peak. Furthermore, the time period Td is shorter than the period between the start of discharging at the node N1 and the current IOUT falling to 0 amperes and also shorter than the period between the start of discharging at the node N1 and the voltage VOUT falling to 0 volts.

The time period Td is defined by the resistor R2, resistor R1, and capacitor C1. The contribution of these elements will be discussed below.

The resistor R2 contributes to the discharging rate at the node N1. In the discharging of the node N1, the voltage reduction rate may be determined by the parasitic capacitance of the node N1, the resistance of the resistor R2, and the ON resistance of the transistor NM2. In particular, if the sum of the resistance of the resistor R2 and the ON resistance of the transistor NM2 is small enough, a high voltage reduction rate of the node N1 can be obtained. If the sum of the resistance of the resistor R2 and the ON resistance of the transistor NM2 is large, the voltage reduction rate of the node N1 becomes low. With the voltage reduction rate of the node N1 too high, the time period Td becomes too short to realize the timing generator 11. If the voltage reduction rate is too low, the current IOUT increases, which may lead to a breakage of the semiconductor device 1. For this reason, the size of the resistor R2 is determined such that the current IOUT will not become too large and the timing generator 11 can be readily realized. If a discharging rate suitable for the arrangement of the timing generator 11 can be attained from the ON resistance of the transistor NM2 only, the resistor R2 does not need to be incorporated.

Once the size of the resistor R2 is determined, the necessary length of the time period Td is determined. The resistance of the resistor R1 and the capacitance of the capacitor C1 are determined in such a manner as to correspond to this length of the time period Td. In particular, the resistance of the resistor R1 and the capacitance of the capacitor C1 are determined such that the propagation delay time from the node N2 to the node N4 is shorter by the time period Td than the propagation delay time from the node N2 to the node N5.

<1-3> Advantageous Effects

The above semiconductor device 1 according to the first embodiment improves the operational reliability. The effects of the semiconductor device 1 according to the first embodiment will be discussed in detail below.

As protection of a load switch in the event of its output terminal being short-circuited to a ground voltage, the method of turning the load switch off has been known. By turning the load switch off to set the output voltage to 0 volts and the output current to 0 amperes, the load switch can be protected from an overcurrent. If the load coupled to this load switch includes an inductance, however, the voltage of the output terminal may become negative when the load switch is turned OFF. With the output terminal having a negative voltage, a breakage or malfunction may occur in the load switch or an electronic device coupled to this load switch. In order to prevent the voltage of the output terminal from falling to a negative voltage, it is preferable that the voltage and output current of the output terminal keep positive values even if the short-circuiting occurs.

The semiconductor device 1 according to the first embodiment includes the timing generator 11. When the comparator CMP1 detects the short-circuited state, the timing generator 11 changes the transistors NM2 and NM3 from the OFF state to the ON state during the time period Td. With the transistor NM2 being in the ON state during the time period Td, the current IOUT can start decreasing after its peak, and the voltage VOUT can stay higher than 0 volts when the transistor NM2 terminates the discharging of the node N1.

Moreover, after the time period Td, the overcurrent protection circuit 20 disabled by the transistor NM3 is enabled, and the current IOUT can be regulated to be equal to or lower than the current IOCL. Together with the regulation of the current, the voltage VOUT is also set to a certain positive value.

As described above, the semiconductor device 1 according to the first embodiment can suppress the overcurrent caused by short-circuiting while maintaining the voltage of the output terminal and the output current at positive values. The semiconductor device 1 according to the first embodiment therefore improves the operational reliability.

<2> Second Embodiment

The semiconductor device according to the second embodiment differs from the semiconductor device according to the first embodiment in the configuration of the short-circuit protection circuit. The following description will focus on the features of a semiconductor device 1a according to the second embodiment that differ from those of the first embodiment.

<2-1> Configuration

Figure 4:
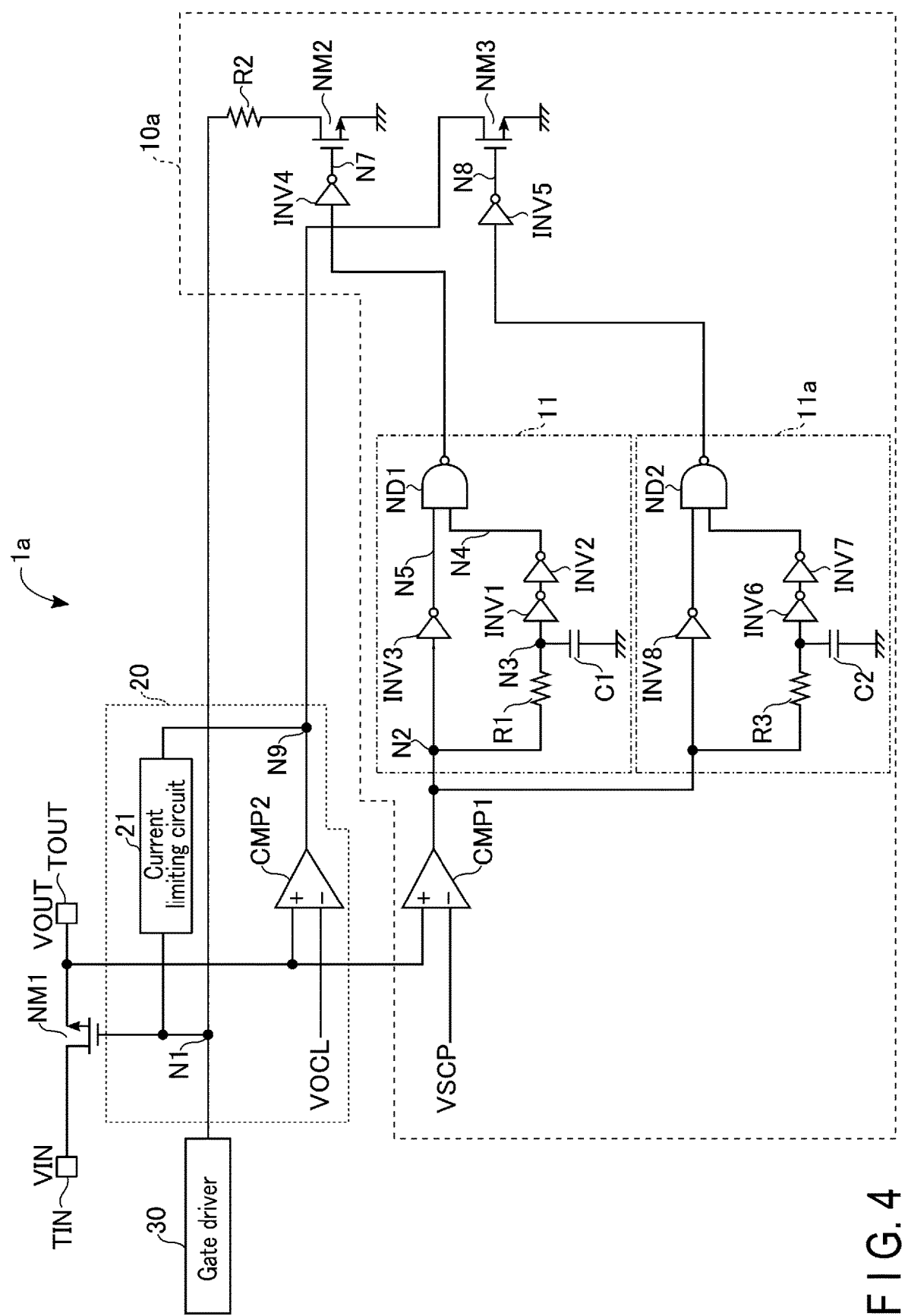
FIG. 4 is a circuit diagram showing an exemplary configuration of a semiconductor device according to the second embodiment.

FIG. 4 is a circuit diagram showing an exemplary configuration of the semiconductor device according to the second embodiment. In the semiconductor device 1a according to the second embodiment, the short-circuit protection circuit 10 of the semiconductor device 1 of the first embodiment is replaced with a short-circuit protection circuit 10a. The short-circuit protection circuit 10a according to the second embodiment differs from the short-circuit protection circuit 10 according to the first embodiment in further including a timing generator 11a including inverters INV6 to INV8, a resistor R3, a capacitor C2, and a NAND gate ND2, where the input terminal of the inverter INV5 is coupled to the timing generator 11a.

One end of the resistor R3 is coupled to the node N2, and the other end of the resistor R3 is coupled to one electrode of the capacitor C2. The other electrode of the capacitor C2 is grounded. The inverter INV6 inverts the logic level of the node coupled to the other end of the resistor R3 and to one electrode of the capacitor C2, and outputs the resultant level to the inverter INV7. The inverter INV7 inverts the output of the inverter INV6 and outputs the resultant level to the NAND gate ND2.

The inverter INV8 inverts the logic level of the node N2 and outputs the resultant level to the NAND gate ND2. The NAND gate ND2 performs a NAND operation upon the output of the inverter INV7 and the output of the inverter INV8, and outputs the result of the operation to the inverter INV5.

The inverter INV5 inverts the output of the NAND gate ND2 and outputs the resultant level to the node N8.

The rest of the configuration of the semiconductor device 1a according to the second embodiment is the same as that of the semiconductor device 1 according to the first embodiment.

<2-2> Operation

The operation of the semiconductor device 1a according to the second embodiment will be described. The operation of the semiconductor device 1a according to the second embodiment differs from that of the semiconductor device 1 according to the first embodiment in that the inverter INV5 and transistor NM3 operate based on the output of the timing generator 11a.

The operations of the inverter INV4 and transistor NM2 based on the output of the timing generator 11 are the same as in the semiconductor device 1 according to the first embodiment. The time period Td, during which the transistor NM2 is turned ON based on the output of the timing generator 11, is determined based on the resistance of the resistor R1 and the capacitance of the capacitor C1.

The timing generator 11a operates in a manner similar to the timing generator 11. The period in which the transistor NM3 is turned ON based on the output of the timing generator 11a will be referred to as a time period Td2. The time period Td2 is determined based on the resistance of the resistor R3 and the capacitance of the capacitor C2.

Other operations of the semiconductor device 1a are the same as those of the semiconductor device 1 according to the first embodiment.

<2-3> Advantageous Effects

The semiconductor device 1a according to the second embodiment is configured to independently set the time period Td during which the transistor NM2 is ON, and the time period Td2 during which the transistor NM3 is ON. In other words, the period of discharging at the node N1 and the period of disabling the overcurrent protection circuit 20 can be independently set. With a timing generator designed in such a manner, the semiconductor device 1a according to the second embodiment can suppress an overcurrent caused by short-circuiting while maintaining the voltage of the output terminal and the output current at positive values in the same manner as in the semiconductor device 1 according to the first embodiment. Thus, the semiconductor device 1a according to the second embodiment can improve the operational reliability.

<3> Modification Examples

According to the above embodiments, a semiconductor device that is a load switch provided with overcurrent protection is arranged on an IC chip. The load switch, however, may be constituted by multiple components such as a combination of an IC chip for controlling the gate voltage and a package of transistors. The same effects as in the embodiments can be produced by a load switch configured by a combination of multiple components.

In the above embodiments, the electronic device that receives power supply from the semiconductor device has been explained using the control circuit of an industrial robot as an example. The configuration of the electronic device that receives power supply from the semiconductor device, however, is not limited to the examples of the embodiments. The power receiving electronic device may be an information processing terminal such as a personal computer or a smartphone.

In the above embodiments, use of one inverter or two serially connected inverters has been described. When multiple inverters are adopted by serially connecting them, the number of inverters may be changed; however, if the original number of inverters is odd, the number after the change must also be an odd number, and if the original number is even, the number after the change must also be an even number. For instance, the configuration with one inverter may be changed to a configuration with three inverters that are serially connected. The configuration with two serially connected inverters may be changed to a configuration with four serially connected inverters.

Throughout the specification, approximately the same voltages represent voltages that can be regarded as approximately equal even if a slight difference is observed in voltages affected by the ON resistance of a transistor, a leak current, a resistance component of the wiring, or the like.

In the present specification, a "connection" and "coupling" indicate that two elements are electrically connected, and do not preclude a connection with another element interposed between the elements. Regarding this "electrical connection", an insulator may be interposed if an operation similar to the one performed by a structure with a direct electrical connection can be achieved. The "ON state" indicates that a voltage higher than or equal to the threshold voltage of a transistor is being applied to the gate of this transistor. The "OFF state" indicates that a voltage lower than the threshold voltage of a transistor is being applied to the gate of this transistor. The OFF state does not preclude a state in which a current as small as a leak current of the transistor passes through the transistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first transistor including a source coupled to a first terminal and a gate coupled to a first node;
   a first circuit; and
   a second circuit,
   wherein the first circuit comprises:
     a first comparator including a non-inverting input terminal coupled to the first terminal and an inverting input terminal to which a first voltage is applied; and
     a current limiting circuit including one end coupled to an output terminal of the first comparator and the other end coupled to the first node, and
   the second circuit comprises:
     a second comparator including a non-inverting input terminal coupled to the first terminal and an inverting input terminal to which a second voltage is applied;
     a second transistor including a source that is grounded and a drain coupled to the first node;
     a third transistor including a source that is grounded and a drain coupled to the output terminal of the first comparator; and
     a third circuit configured to turn on the second transistor and the third transistor for a first time period based on an output of the second comparator, and
   if a power supply voltage is applied to a drain of the first transistor and the first terminal is short-circuited to a node of a ground voltage, the third transistor performs discharging at the output terminal of the first comparator for the first time period so as to disable the first circuit.

2. The semiconductor device according to claim 1, wherein
if the power supply voltage is applied to the drain of the first transistor and the first terminal is short-circuited to the node of the ground voltage, the second transistor and the third transistor are in an ON state for the first time period.

3. The semiconductor device according to claim 1, wherein
if the power supply voltage is applied to the drain of the first transistor and the first terminal is short-circuited to the node of the ground voltage, the second transistor performs discharging at the first node, and a voltage of the first terminal is maintained at higher than 0 volts for the first time period.

4. The semiconductor device according to claim 1, wherein
if the power supply voltage is applied to the drain of the first transistor and the first terminal is short-circuited to the node of the ground voltage, the second transistor performs discharging at the first node for the first time period so as to reduce a current that passes through the first transistor.

5. The semiconductor device according to claim 1, wherein
the third circuit includes a first resistor, a first capacitor, a first inverter, a second inverter, a third inverter, a first NAND gate, a fourth inverter, and a fifth inverter,
the first resistor includes one end coupled to an output terminal of the second comparator and the other end coupled to one electrode of the first capacitor,
the other electrode of the first capacitor is grounded,
an input terminal of the first inverter is coupled to the other end of the first resistor,
an input terminal of the second inverter is coupled to an output terminal of the first inverter,
an input terminal of the third inverter is coupled to the output terminal of the second comparator,
the first NAND gate performs a NAND operation upon an output of the second inverter and an output of the third inverter, and outputs a result of the NAND operation,
an input terminal of the fourth inverter is coupled to an output terminal of the first NAND gate, an output terminal of the fourth inverter is coupled to a gate of the second transistor, and
an input terminal of the fifth inverter is coupled to the output terminal of the first NAND gate, and an output terminal of the fifth inverter is coupled to a gate of the third transistor.

6. The semiconductor device according to claim 1, wherein
a second resistor is arranged between the drain of the second transistor and the first node.

7. The semiconductor device according to claim 1, further comprising:
a fourth circuit configured to supply a voltage to the first node.

8. The semiconductor device according to claim 1, wherein
the first voltage is higher than the second voltage.

9. The semiconductor device according to claim 1, wherein
the third circuit includes a first resistor, a first capacitor, a first inverter, a second inverter, a third inverter, a first NAND gate, a fourth inverter, a fifth inverter, a third resistor, a second capacitor, a sixth inverter, a seventh inverter, an eighth inverter, and a second NAND gate,
the first resistor includes one end coupled to an output terminal of the second comparator and the other end coupled to one electrode of the first capacitor,
the other electrode of the first capacitor is grounded,
an input terminal of the first inverter is coupled to the other end of the first resistor,
an input terminal of the second inverter is coupled to an output terminal of the first inverter,
an input terminal of the third inverter is coupled to the output terminal of the second comparator,
the first NAND gate performs a first NAND operation upon an output of the second inverter and an output of the third inverter, and outputs a result of the first NAND operation,
an input terminal of the fourth inverter is coupled to an output terminal of the first NAND gate, an output terminal of the fourth inverter is coupled to a gate of the second transistor,
one end of the third resistor is coupled to the output terminal of the second comparator, the other end of the third resistor is coupled to one electrode of the second capacitor,
the other electrode of the second capacitor is grounded,
an input terminal of the sixth inverter is coupled to the other end of the third resistor,
an input terminal of the seventh inverter is coupled to an output terminal of the sixth inverter,
an input terminal of the eighth inverter is coupled to the output terminal of the second comparator,
the second NAND gate performs a second NAND operation upon an output of the seventh inverter and an output of the eighth inverter, and outputs a result of the second NAND operation, and
an input terminal of the fifth inverter is coupled to an output terminal of the second NAND gate, and an output terminal of the fifth inverter is coupled to a gate of the third transistor.

* * * * *